United States Patent
O'Brien et al.

(12)
(10) Patent No.: US 6,379,635 B2
(45) Date of Patent: Apr. 30, 2002

(54) PROCESS FOR PREPARING A NANOCRYSTALLINE MATERIAL

(75) Inventors: Paul O'Brien, Loughton (GB); Tito Trin Dade, Ilhavo (PT)

(73) Assignee: Imperial College of Science, Technology & Medicine, London (GB)

( * ) Notice: Subject to any disclaimer, the term of this patent is extended or adjusted under 35 U.S.C. 154(b) by 0 days.

(21) Appl. No.: 09/043,258

(22) PCT Filed: Aug. 9, 1996

(86) PCT No.: PCT/GB96/01942

§ 371 Date: Sep. 9, 1998

§ 102(e) Date: Sep. 9, 1998

(87) PCT Pub. No.: WO97/10175

PCT Pub. Date: Mar. 20, 1997

(30) Foreign Application Priority Data

Sep. 15, 1995 (GB) .............................................. 9518910

(51) Int. Cl.⁷ ............................................... C01B 19/04
(52) U.S. Cl. ........................... 423/87; 423/92; 423/101; 423/122; 423/509; 423/566.1
(58) Field of Search ............................ 423/87, 92, 101, 423/122, 509, 566.1; 438/97; 136/258 AM; 362/800

(56) References Cited

U.S. PATENT DOCUMENTS 3,895,943 A * 7/1975 Hanada et al.
H459 H 4/1988 Stanley
5,059,346 A * 10/1991 Spanhel et al.

FOREIGN PATENT DOCUMENTS

WO  WO 95/20693  8/1995

OTHER PUBLICATIONS

Chemistry of Materials, vol. 2, No. 2, pp. 141–149, Mar. 1, 1990.

Journal of American Chemical Society, vol. 115, pp. 8706–8715, 1993.

Journal of American Chemical Society, vol. 112, pp. 1327–1332, 1990.

* cited by examiner

Primary Examiner—Steven P. Griffin
Assistant Examiner—Christina Ildebrando
(74) Attorney, Agent, or Firm—Frommer Lawrence & Haug LLP; Thomas J. Kowalski

(57) ABSTRACT

A process for preparing a nanocrystalline material comprising at least a first ion and at least a second ion different from the first ion, and wherein at least the first ion is a metal ion, is described. The process comprises contacting a metal complex comprising the first ion and the second ion with a dispersing medium suitable to form the nanocrystalline material and wherein the dispersing medium is at a temperature to allow formation by pyrolysis of the nanocrystalline material when contacted with the metal complex.

22 Claims, 3 Drawing Sheets

PROCESS FOR PREPARING A NANOCRYSTALLINE MATERIAL

Figure 1:
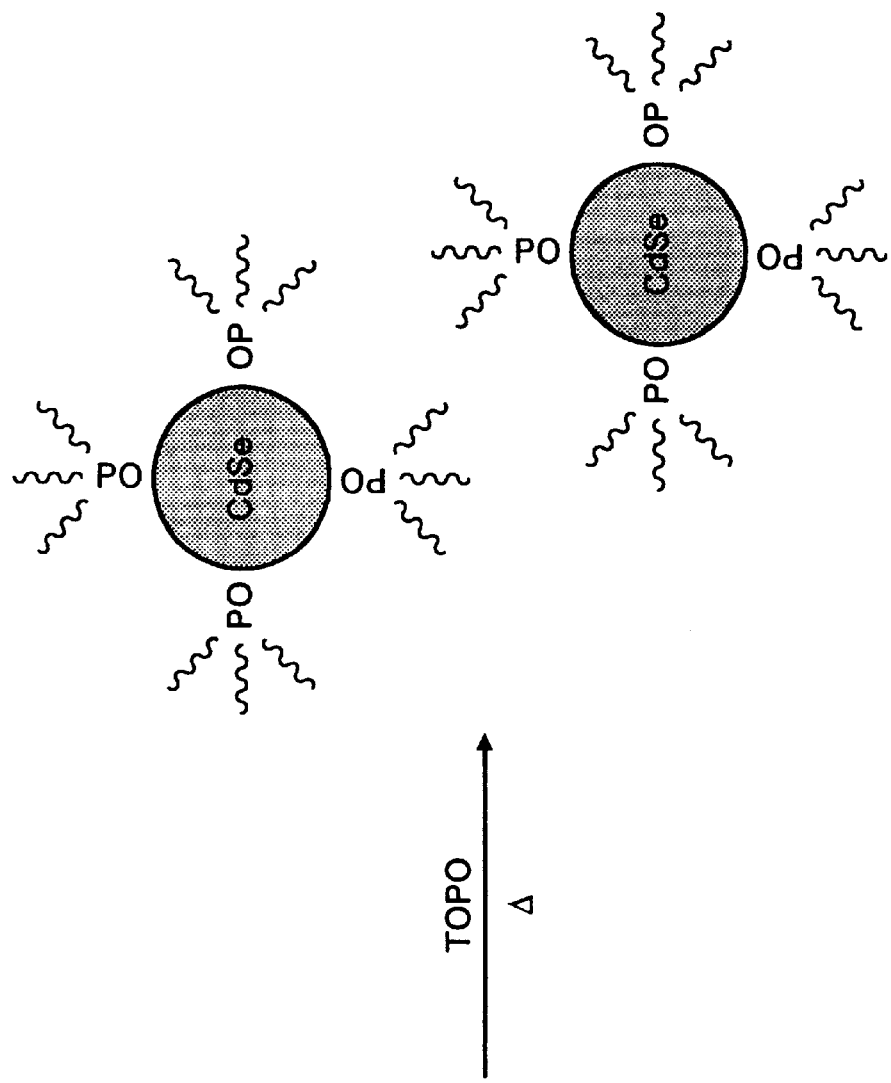

The present invention relates to a process. In particular, the present invention relates to a process for synthesising nanocrystalline materials, such as nanocrystalline CdSe.

Nanocrystalline materials, which are sometimes referred to as nanoparticles, Q-particles, quantum dots or nanocrystallites, have been recognised as suitable systems for studying the transition from the molecular to the macrocrystalline level and have been extensively studied in the recent years. (D. Duonghong et al., *J. Am. Chem. Soc.* 1982, 104, 2977, R. Rossetti et al., *J. Chem. Phys.*, 1984, 80, 4464, A. Henglein, *Chem. Rev.*, 1989, 89, 1861, M. L. Steigerwald and L. E. Brus, *Acc. Chem. Res.*, 1990, 23, 183, Y. Wang and N. Herron, *J. Phys. Chem.* 1991, 95, 49, H. Weller, *Adv. Mater.* 1993, 5, 88, A. Hagfeldt and M. Gratzell, *Chem. Rev.* 1995, 95, 49, L. E. Brus, *J. Chem. Phys.* 1984, 80, 4403, L. Brus, *J. Phys. Chem.* 1986, 90, 2555, P. E. Lippens and M. Lannoo, *Phys. Rev.* B 1989, 39, 10935 and Y. Nosaka, *J. Phys. Chem.* 1991, 95, 5054.)

Interest in research into new synthetic routes for semiconductor nanocrystallites is now enhanced as devices based on such materials have been fabricated. (V. L. Colvin, et al., Nature 1994, 39, 10935, B. O. Dabbousi et al., *Appl. Phys. Lett.*, 1995, 66, 1317 and R. S. Urquhart et al., *Langmuir*, 1995, 11, 1127.) A number of synthetic methods have been reported for the preparation of a wide range of semiconductor nanoparticles (D. Duonghong et al., *J. Am. Chem. Soc.* 1982, 104, 2977, R. Rossetti et al., *J. Chem. Phys.*, 1984, 80, 4464, A. Henglein, *Chem. Rev.*, 1989, 89, 1861, M. L. Steigerwald and L. E. Brus, *Acc. Chem. Res.*, 1990, 23, 183, Y. Wang and N. Herron, *J. Phys. Chem.* 1991, 95, 49, H. Weller, *Adv. Mater.* 1993, 5, 88, A. Hagfeldt and M. Gratzell, *Chem. Rev.* 1995, 95, 49, Y. Wang and N. Herron, *J. Phys. Chem.* 1987, 91, 257, H. J. Watzke and J. N. Fendler, *J. Phys. Chem.*, 1987, 91, 854, P. C. Sercel et al., *Appl. Phys. Lett.* 1992, 61, 696, V. Sankaran et al., *Chem. Mater.* 1993, 5, 1133, A. Mews et al., *J. Phys. Chem.* 1994, 98, 934, O. V. Salata et al., *Appl. Phys. Lett.* 1994, 65, 189, M. L. Steigerwald et al., *J. Am. Chem. Soc.* 1998, 110, 3046, A. R. Kortan et al., *J. Am. Chem. Soc.* 1990, 112, 1327 and J. G. Brerman et al., *J. Am. Chem. Soc.* 1989, 111, 4141.)

Known processes for preparing nanocrystalline materials, such as nanocrystalline CdSe, have included arrested precipitation in micelles (M. L. Steigerwald et al) or the reaction of molecular species at high temperature in organic solvents. (A. R. Kortan et al., *J. Am. Chem. Soc.* 1990, 112, 1327, J. G. Brenman et al., *J. Am. Chem. Soc.* 1989, 111, 4141, C. B. Murray et al. *J. Am. Chem. Soc.*, 1993, 115, 8706 and J. E. Bowen Katari et al., *J. Phys. Chem.* 1994, 98, 4109.)

In more detail, Murray et al report on the preparation of CdE (where E is S, Se or Te) by the pyrolysis of two organometallic reagents by injection into a hot coordinating solvent. In particular, the Murray process involves injecting a solution of $(CH_3)_2Cd$ in TOP (tri-n-octylphosphine) into a hot solution of TOP containing Se (TOPSe and TOP). Alternatively, any one of $(TMS)_2S$ (bis(trimethylsilyl) sulphide), $(TMS)_2Se$ (bis(trimethylsilyl)selenide), and $(BDMS)_2Te$ (bis(tert-butyldimethylsilyl)tellurium) may be used instead of TOPSe.

In the Murray process $(CH_3)_2Cd$ is chosen as the only Cd source. Moreover, Murray et al state that $(TMS)_2Se$ or TOPSe and TOPTe are selected as chalcogen sources with TOPSe and TOPTe preferred due to their ease of preparation and their stability.

Chemical reactions in TOPO (tri-n-octylphosphine oxide) are also described by (C. B. Murray et al.). These processes have been used to prepare nanocrystallites of II/VI semiconductors (V. L. Colvin et al, B. O. Dabbousi et al, C. B. Murray et al and J. E. Bowen Katari et al.). In this instance, TOPO is used as dispersing medium and a metal source (e.g $Cd(CH_3)_2$) and a chalcogenide source (e.g. TOPSe) are injected into the hot TOPO (typically at 250° C.) to form CdSe nanocrystallites. The size distribution of the semiconductor can be controlled by the temperature of heating during the synthesis and by size selective precipitation of the final material. (C. B. Murray et al and J. E. Bowen Katari et al.)

A refinement of the Murray process has been proposed by (J. E. Bowen Katari et al). As with the Murray process, in the Katari process CdE is prepared by the pyrolysis of two organometallic reagents by injection into a hot coordinating solvent. In the Katari process Se is dissolved in TBP (tributylphosphine) to which $(CH_3)_2Cd$ is then added. The resultant $(CH_3)_2Cd/Se$ solution is then added to a heated solution of TOPO.

As with the Murray process, in the Katari process $(CH_3)_2Cd$ is chosen as the only Cd source.

There are however problems associated with the prior art processes for preparing nanocrystalline materials. For example, both the Murray process (C. B. Murray et al) and the Katari process (J. E. Bowen Katari et al) involve the use of hazardous chemicals, in particular $(CH_3)_2Cd$. In this regard, $(CH_3)_2Cd$ is toxic, volatile and extremely difficult to handle. Moreover, on exposure to air it undergoes spontaneous combustion.

Aside from using the hazardous compound $Cd(CH_3)_2$ (V. L. Colvin et al and B. O. Dabbousi et al) to prepare nanocrystalline CdSe, other workers have used the equally hazardous $H_2Set$ (R. S. Urquhart et al) for the synthesis of the CdSe.

The present invention seeks to overcome the problems associated with the prior art processes for making nanocrystalline materials.

According to a first aspect of the present invention there is provided a process for preparing a nanocrystalline material comprising at least a first ion and at least a second ion different from the first ion, and wherein at least the first ion is a metal ion, the process comprising contacting a metal complex comprising the first ion and the second ion with a dispersing medium suitable to form the nanocrystalline material and wherein the dispersing medium is at a temperature which allows formation of the nanocrystalline material by pyrolysis when contacted with the metal complex.

According to a second aspect of the present invention there is provided a nanocrystalline material obtained by the process of the present invention.

According to a third aspect of the present invention there is provided a device comprising a nanocrystalline material obtained by the process of the present invention.

Preferably the metal ion is a divalent metal ion or a trivalent metal ion.

Preferably the metal ion is selected from a cadmium ion, a zinc ion, a lead ion, a mercury ion, an indium ion and a gallium ion, including combinations thereof.

Preferably the second ion is selected from an oxide ion, a selenide ion, a sulphide group, a phosphide group or an arsenide ion, or combinations thereof.

Preferably the second ion is or is part of a thiol-carbamate group or a seleno-carbamate group.

Preferably the second ion is or is part of a dithiol-carbamate group or a diseleno-carbamate group.

Preferably the metal complex additionally comprises an organic group and/or thio group. The organic group can be an alkyl group or an aryl group, which may be substituted.

Preferably the organic group is an alkyl group, which may be substituted and/or unsaturated.

Preferably the organic group is a dialkyl group, which may be substituted and/or unsaturated, and/or wherein the thio group is a dithio group.

Preferably the organic group is a di-$C_{1-6}$alkyl group and/or the thio group is a dithio group or a diseleno group.

Preferably the organic group is a diethyl group.

Preferably the dispersing medium is at a temperature of 250° C. or more, preferably about from 300° C. to 350° C.

Preferably the dispersing medium passivates the surface of the nanocrystalline material.

Preferably the dispersing medium is TOPO, or a related coordinating medium, including combinations thereof. Another dispersing medium could be TBP.

Preferably the nanocrystalline material comprises or is selected from any one of cadmium selenide, cadmium sulphide, zinc selenide, zinc sulphide, indium phosphide and gallium arsenide, including ternary and quaternary combinations thereof.

Preferably the nanocrystalline material is cadmium selenide.

Preferably the metal complex is diethyl diselenocarbamato cadmium or dithio diselenocarbamato cadmium, or related mixed alkyl complexes thereof.

Preferably the device is an optical device.

Preferably the device is any one of a non-linear optic device, a solar cell or an LED.

Preferably the device is an LED.

Preferably the device is a blue LED.

The present invention is therefore based on the surprising finding that nanocrystalline materials can be prepared by using as a reactant a metal complex which provides at least two of the ions of the nanocrystalline material. The process of the present invention is therefore very different to the Murray process (C. B. Murray et al) and the Katari process (J. E. Bowen Katari et al) wherein in each of those processes it is necessary to use two independent sources to provide at least two of the ions of the nanocrystalline material. Thus, the use of a molecular precursor containing both elements in the present process provides an attractive route to metal selenides, especially if a large scale preparation is anticipated.

The present invention is further advantageous over the prior art processes as it does not rely on the use of hazardous chemicals such as $(CH_3)_2Cd$.

The present invention is further advantageous as it provides a low cost route to prepare photovoltaic materials and optoelectronic materials, preferable examples of which include non-linear optic devices, solar cells and LEDs.

Thus the present invention shows that a single source can be used in a dispersing medium, such as TOPO, to replace the use of the hazardous metal alkyls. In a highly preferred embodiment, the present invention provides the synthesis of CdSe nanocrystallites using methyl diethyldiselenocarbamato cadmium (II) MeCddsc: $[(CH_3)CdSe_2CN(C_2H_5)_2]_2$) as a precursor. The synthetic method of this preferred embodiment is diagrammatically illustrated in FIG. 1, which makes no efforts to represent a mechanistic pathway.

Even though the pathway shown in FIG. 1 is for the synthesis of CdSe it is to be understood that the process of the present invention is useful for preparing a series of nanocrystalline materials.

Examples of nanocrystalline materials that can be prepared using an appropriate single molecule precursor can be represented by the general formulae A and B as shown below.

$$M''E \qquad \text{GENERAL FORMULA A}$$

wherein M is Zn, Cd, Hg or a divalent transition metal; and wherein E is O, S, Se, P, or As.

$$M'''_xE_y \qquad \text{GENERAL FORMULA B}$$

wherein M is Al, In, Ga or a trivalent transition metal; and wherein E is O, S, Se, P, or As; and wherein x and y are appropriate intergers.

Formulae A and B also encompass related ternary systems.

Therefore, examples of nanocrystalline materials other than cadmium selenide include cadmium sulphide, zinc selenide, zinc sulphide, indium phosphide and gallium arsenide.

The general formula of the metal complex for use in the process of the present invention can be represented as:

$$ML_n \qquad \text{FORMULA I}$$

wherein M represents a metal ion; L represents one or more ligands which need not be the same; n represents the valency of the metal; and wherein M is the first ion of the nanocrystalline material and at least one L provides the second ion for the nanocrystalline material.

Typically M is a divalent metal ion or a trivalent metal ion, such as any one of cadmium, zinc, lead, mercury, indium gallium, including combinations thereof.

Typically L is any one of an oxide ion, a selenide ion, a sulphide group, a phosphide group or an arsenide ion, or combinations thereof. More in particular L is or is part of any one of a thiol-carbamate group or a seleno-carbamate group, such as a dithiolcarbamate group or a diselenocarbamate group.

In a preferred embodiment, at least one L is an organic group and/or a thio group. If at least one L is an organic group then preferably that organic is an alkyl group, which may be substituted and/or unsaturated, such as a $C_{1-10}$ (preferably $C_{1-6}$, more preferably $C_{1-4}$) alkyl group, which may be substituted and/or unsaturated.

Preferably, at least one L is a dialkyl group, which may be substituted and/or unsaturated, and/or wherein the thio group is a dithio group. Preferably, the organic group is a di-$C_{1-6}$ alkyl group and/or the thio group is a dithio group or a diseleno group. In a highly preferred embodiment, at least one L is a diethyl group.

Typical general formulae for suitable metal complexes containing at least one organic group for use as single molecule precursors in the process of the present invention are shown below as Formula II (for metals that are divalent) and as Formula III (for metals that are trivalent):

$$[R''-M''-(E_xCNRR')_y]_z \qquad \text{FORMULA II}$$

$$[(R'')(R''')-M'''-(E_xCNRR')_y]_z \qquad \text{FORMULA III}$$

wherein R, R', and R''' independently represent an aryl or alkyl group as defined above, which may be substituted and/or unsaturated; M'' is a divalent metal ion; M''' is a trivalent metal ion; E is any one of an oxide ion, a selenide ion, a sulphide group, a phosphide group or an arsenide ion, or combinations thereof (such as, by way of example, —O—S—); x is an integer, preferably 2; y is an integer; and z is an integer, usually 1 or 2.

As mentioned above, a highly preferred metal complex containing at least one organic group for use as a single molecule precursor in the process of the present invention is methyl diethyldiselenocarbamato cadmium (II) (MeCddsc)

wherein R is $C_2H_5$; $R'$ is $C_2H_5$; $R''$ is $(CH_3)$; M is $Cd^{II}$; E is Se; x is 2; y is 1; and z is 2.

However, other preferred metal complexes containing at least one organic group for use as single molecule precursors in the process of the present invention include $$M-(E_2CNAlk_2)_n \qquad \text{FORMULA IV}$$

wherein n is 2 for metals such as zinc, cadmium and lead; n is 3 for metals such as gallium or indium; E is S or Se; and A is an aryl or alkyl group, preferably ethyl; including carbamate (i.e. O-donors) thereof:
and either $$R''-M-(E_2CNA_2)_n \qquad \text{FORMULA V}$$

or $$(R'')_n-M-(E_2CNA_2) \qquad \text{FORMULA VI}$$

wherein n is 1 for metals such as zinc, cadmium and lead; n is 2 for metals such as gallium or indium; E is S or Se; A is an aryl or an alkyl group, preferably ethyl; and $R''$ is independently selected from an alkyl or aryl group as defined above, such as methyl.

Other possible metal complexes for use as single molecule precursors in the process of the present invention include related thiolates, thiophosphinates or phosphinochalcogens and related selenium containing compounds.

Figure 2:
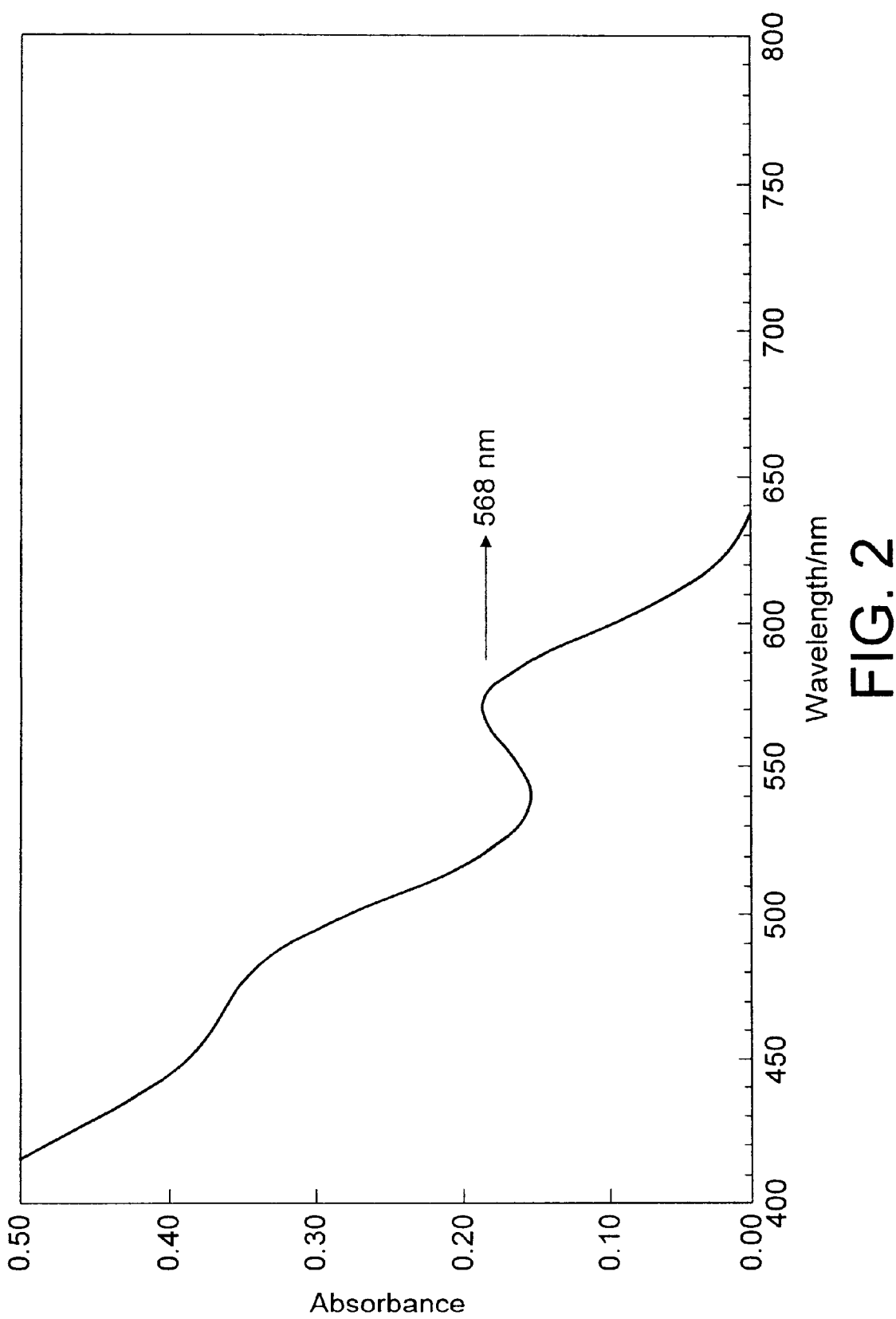
Figure 3:
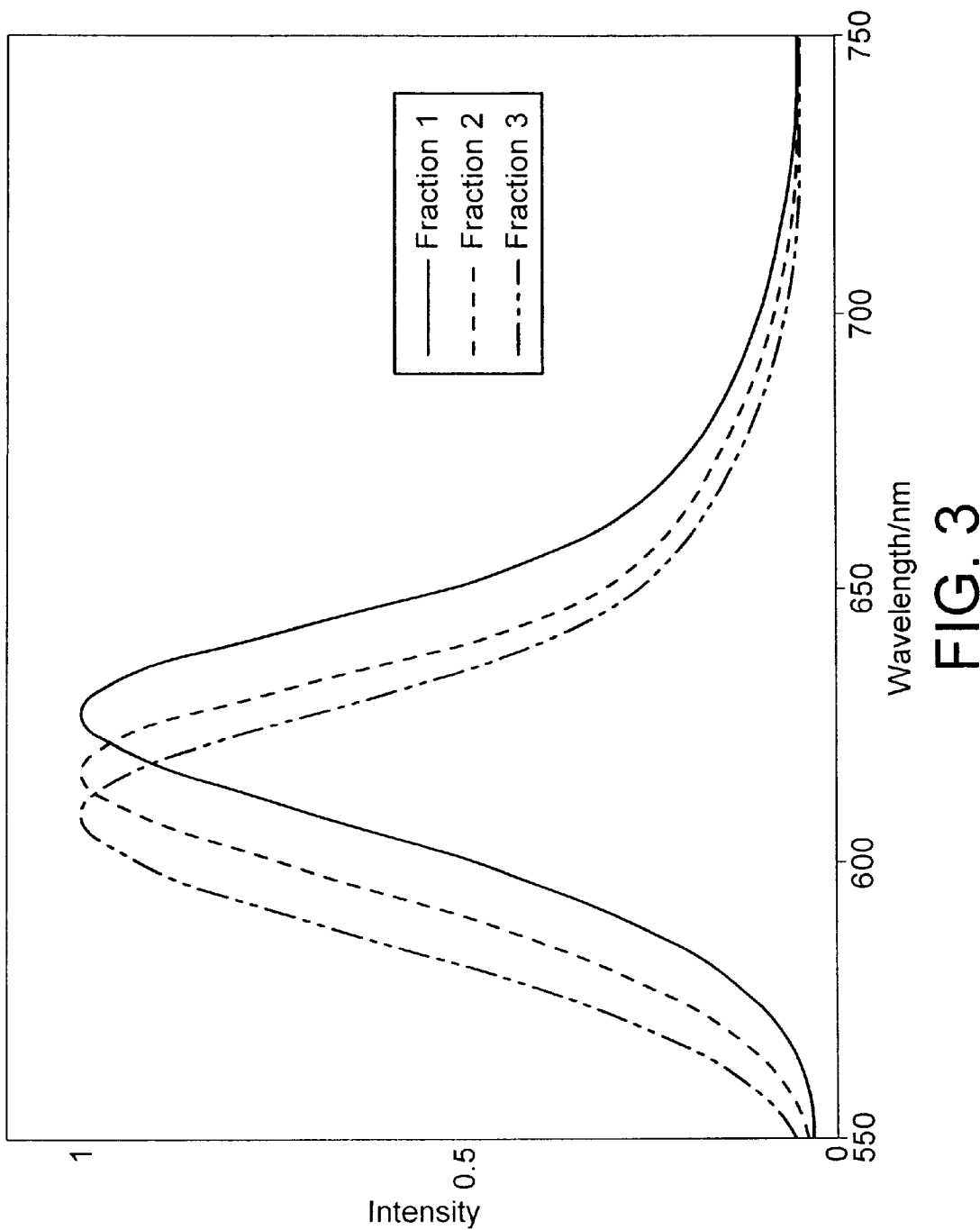

The present invention will now be described only by way of examples. In the examples, reference is made to the attached Figures wherein FIG. 1 is a scheme of the synthetic method of CdSe nanocrystallites using a single source;

FIG. 2 is an optical absorption spectrum of CdSe nanocrystallites dispersed in toluene (fraction 3)—the inset shows the particle size distribution of the same sample as determined by TEM; and FIG. 3 is a fluorescence emission spectra of size fractionated CdSe ($\lambda$exc=465 nm).

EXPERIMENTAL

1. Preparation of Nanocrystalline Cadmium Selenide 1.1 MeCddsc was synthesised by the comproportionation reaction (M. B. Hursthouse et al, *Polyhedron*, 1992, 11, 45) between $Cd(CH_3)_2$ (Epichem) and bisdiethyldiselenocarbamnato cadmium (II) in dry toluene, at room temperature, using Schlenk techniques and a nitrogen atmosphere. The TOPO (90%, Aldrich) was purified using the method described in the literature. (G. W. Mason et al, *J. Inorg. Nuclear Chem.*, 1960, 12, 315.) The identity of MeCddsc and the purity of TOPO were checked by $^1H$ nmr and IR spectroscopy and melting point measurements.

1.2 MeCddsc (0.5 mmol) was placed in 10 ml of TOP (98%, Aldrich) and the mixture formed was filtered after which was injected in 30 g of TOPO at 200° C. The temperature of the solution was then raised to 250° C. and heated for half an hour. The deep red solution that formed was allowed to cool down to 75° C. after which a large excess of dry $CH_3OH$ (BDH) was added. A flocculate precipitate formed and was isolated by centrifugation and redispersed in toluene, any insoluble material was then discarded. The toluene was pumped off under vacuum ($10^{-2}$ Torr) to give a deep red material which was washed with $CH_3OH$. The solid was redispersed in toluene to give solutions with a Port wine red colour which remained optically clear for weeks. Size selective precipitation was performed by adding $CH_3OH$ to this solution until turbidity was observed followed by centrifugation the solid. This procedure was successively applied to the supernatant solutions obtained during the fractionation process until no optical absorption was detected.

1.3 The toluene solutions containing the nanocrystallites were characterised by optical absorption spectroscopy (Philips PU 8710 spectrophotometer) and fluorescence emission spectroscopy (Perkin Elmer LS50 luminescence spectrometer), at room temperature. The fluorescence spectra were normalized with the maximum set to one hundred. The X-ray powder diffraction experiments were performed using a Philips 1130 X-ray generator and a Guinier camera. Conventional transmission electron microscopy (TEM) of the nanocrystallites was performed using a JEOL-JEM 1200 EX II scanning and transmission electron microscope, operating at 100 kV, on samples deposited over carbon coated copper grids. The histogram was obtained after measuring the diameter of around 300 nanoparticles shown on the TEM images. High resolution transmission electron microscopy (HRTEM) was performed using a JEOL FX 2000 instrument, operating at 200 kV, on samples deposited over carbon coated copper grids.

1.4 The optical absorption spectrum of a toluene solution containing nanodispersed CdSe obtained from the thermal decomposition of MeCddsc is shown in FIG. 2. The absorption edge of the spectrum is clearly blue shifted in relation to the bulk band gap of CdSe (716 nm, 1.73 eV) suggesting the presence of nanoparticles with sizes below the bulk exciton dimensions of CdSe. The maximum observed in the optical spectrum of nanodispersed CdSe has been associated with the lowest energy electronic transition occurring in the CdSe nanocrystallites.[21-25]

1.5 The emission fluorescence spectra of different size fractionated samples of CdSe are depicted in FIG. 3. The size selective precipitation is based on the fact that the largest particles are the first to precipitate, due to the stronger Van der Waals interactions, on the addition of a non-solvent to the nanodispersed material. Using this procedure it is possible to obtain initial solid fractions richer in larger particles as compared with the later fractions. The maximum of the emission band in FIG. 3 is gradually blue shifted as the size distributions become weighted of smaller dimensions particles. Such shifts on the band edge (FIG. 2) and band maximum (FIG. 3) in the absorption and emission spectra, respectively, have been reported as an evidence of quantum size effects. (D. Duonghong et al., R. Rossetti et al., A. Henglein, M. L. Steigerwald and L. E. Brus, Y. Wang and N. Herron, H. Weller, and A. Hagfeldt and M. Gratzell)

1.6 The fluorescence spectrum of fraction 3 corresponds to the optical absorption spectrum in FIG. 2. The emission band maximum is observed at a wavelength close to the absorption edge of the optical spectrum (band edge emission); the typical red emission due to the recombination of charge carriers on deep traps located at the particles surface was not detected. These results suggest that surface coverage with TOPO molecules should have occurred on the CdSe nanocrystallites. (R. Rossetti et al, C. B. Murray et al, J. E. Bowen Katari et al and N. Chestnoy et al) The energy dispersive analysis X-ray results (EDAX) for CdSe nanocrystallites (after several washings with methanol) still show the presence of phosphorous, suggesting that the TOPO molecules are quite firmly bond to the CdSe nanocrystallites.

1.7 The dark red powder obtained from the synthesis gave an X-ray diffraction pattern consistent with hexagonal CdSe.

The TEM image of the fraction 3 of CdSe giving the spectra in FIG. 2 and FIG. 3 was studied. The mean particle diameter of the nanocrystalline material was found to be 51.9±7.4 Angstroms. The TEM results show that the CdSe nanocrystallites are approximately spherical and close to monodispersed. On the basis of the effective mass approximation (M. L. Steigerwald and L. E. Brus) the excitonic peak located at 568 nm (2.18 eV) suggests the presence of CdSe nanoparticles with a diameter close to 57 Angstroms, discrepancies between the experimentally measured particle diameter and the predictions of the effective mass approximation have been reported by other authors. (C. B. Murray et al.)

1.8 The crystallinity of the CdSe nanoparticles was confirmed by HRTEM. The HRTEM images showed the typical hexagonal pattern of the wurtzite structure for some of the particles in agreement with the X-ray powder diffraction results. The analysis of several images are consistent with the presence of some CdSe nanocrystallites with stacking faults. This type of defect for CdSe nanocrystallites has been reported by other authors (C. B. Murray et al.). J. E. Bowen Katari et al. reported the synthesis of CdSe nanocrystallites, using a TOPO method at higher temperatures for which no stacking faults were detected.

2. Preparation of Nanocrystalline Indium Sulphide 2.1 Initially $Me_2InS_2CNEt_2$ was prepared by a comproportionation reaction between stoichiometric amounts of tris(diethyldithiocarbarmato)indium(III) (5.7 g, 10.2 mmol) and trimethylindium (3.3 g) in toluene (40 mL). The mixture was stirred at room temperature for half an hour and then heated to 50° C. and stirred for further 10 min. On concentration, white crystals settled out from the clear solution (7.90 g, 88%), mp 84° C.

2.2 The compound prepared by the process of 2.1 was then used to replace MeCddsc in Section 1.2 (supra). The product, nanocrystalline indium sulphide, was then analysed using the methods outlined in Sections 1.4–1.8.

3. Preparation of Nanocrystalline Gallium Sulphide 3.1 Initially $Me_2GaS_2CNEt_2$ was prepared by a comproportionation reaction between stoichiometric amounts of tris(diethyldithiocarbarmato)gallium(III) and trimethylgallium in toluene (40 mL). The mixture was stirred at room temperature for half an hour and then heated to 50° C. and stirred for further 10 min. On concentration, crystals settled out from the solution.

3.2 The compound prepared by the process of 3.1 was then used to replace MeCddsc in Section 1.2. The product, nanocrystalline gallium sulphide, was then analysed using the methods outlined in Sections 1.4–1.8.

4. Preparation of Other Precursors for the Preparation of Nanocrystalline Indium Sulphide and Nanocrystalline Gallium Sulphide 4.1 The precursor molecules described in Sections 2.1 and 3.1 could be respectively replaced with $Et_2InS_2CNEt_2$, $Np_2InS_2CNEt_2$, $Et_2GaS_2CNEt_2$, and $Np_2GaS_2CNEt_2$. In this regard these compounds were prepared by the following general protocol, which refers to the preparation of $Et_2InS_2CNEt_2$ though of course the other compounds are prepared by use of similar and appropriate reactants.

4.2 $Et_2InS_2CNEt$ was prepared by adding sodium diethyldithiocarbamate (2.73 g, 15.97 mmol) to a solution of chlorodiethylindium (3.33 g, 15.97 mmol) in ether (60 mL) and stirred for 12 h at room temperature. A white solid (NaCl) formed during the reaction which was removed by filtration. The colourless filtrate containing the product was evaporated to dryness under vacuum. The solid product contained traces of salt and was dissolved in petroleum spirits (60–80° C.) and filtered. The filtrate, on concentration, gave white crystals of diethyldiethyldithiocarbamatoindium (III) (3.33 g, 65%), mp 57° C.

4.3 As mentioned above, $Np_2InS_2CNEt_2$ was prepared in a similar manner and was obtained as a white crystalline solid (2.97 g, 70%), mp 44° C.

4.4 As mentioned above, $Et_2GaS_2CNEt_2$ (4.51 g, 75%) and $Np_2GaS_2CNEt_2$ (3.25 g. 72%), both liquids, were prepared in a similar manner.

4.5 The compounds of 4.1 to 4.4 were then used to replace MeCddsc in Section 1.2 (supra). The respective nanocrystalline products were then analysed using the methods outlined in Sections 1.4–1.8.

5. Preparation of Nanocrystalline Zinc Sulphide 5.1 Initially $[Zn[S_2CNMe^iPr]_2]_2$ was prepared as follows. A mixture of "zinc hydroxide" (4.77 g, 48 mmol), N-methylisopropylamine (10 ml, 96 mmol) and carbon disulphide (5.76 ml, 96 mmol) were suspended in ethanol and stirred at ca. 60° C. for 2 hours. On cooling, the reaction mixture was filtered affording a white solid which was then dried at room temperature in vacuo and recrystallised from acetone. Yield 11.7 g, 67.6%.

5.2 The compound prepared by the process of 5.1 was then used to replace MeCddsc in Section 1.2. The product, nanocrystalline zinc sulphide, was then analysed using the methods outlined in Sections 1.4–1.8.

6. Preparation of Nanocrystalline Cadmium Sulphide 6.1 Initially $[Cd[S_2CNMe^iPr]_2]_2$ was prepared as follows. A mixture of cadmium hydroxide, N-methylisopropylamine and carbon disulphide were suspended in ethanol and stirred at ca. 60° C. for 2 hours. On cooling, the reaction mixture was filtered affording a solid which was then dried at room temperature in vacuo and recrystallised from acetone.

6.2 The compound prepared by the process of 6.1 was then used to replace MeCddsc in Section 1.2. The product, nanocrystalline cadmium sulphide, was then analysed using the methods outlined in Sections 1.4–1.8.

7. Preparation of Nanocrystalline Zinc Arsenide 7.1 Initially $[Zn[As_2CNMe^iPr]_2]_2$ was prepared by appropriately adapting the process of Section 5.1.

7.2 The compound prepared by the process of 7.1 was then used to replace MeCddsc in Section 1.2. The product, nanocrystalline zinc arsenide was then analysed using the methods outlined in Sections 1.4–1.8.

8. Preparation of Nanocrystalline Cadmium Arsenide 8.1 Initially $[Cd[As_2CNMe^iPr]_2]_2$ was prepared by appropriately adapting the process of Section 6.1.

8.2 The compound prepared by the process of 8.1 was then used to replace MeCddsc in Section 1.2 (supra). The product, nanocrystalline cadmium arsenide was then analysed using the methods outlined in Sections 1.4–1.8.

9. Preparation of Further Nanocrystalline Materials 9.1 The following compounds were used to replace MeCddsc in Section 1.2. The respective nanocrystalline materials were then analysed using the methods outlined in Sections 1.4–1.8.

9.2 The following commentary describes the preparation of $(C_5H_{11})_2GaP^tMu_2$, however the process can be appropriately adapted for the preparation of $(C_5H_{11})_2IndiumP^tBu_2$, $(C_5H_{11})_2GalliumAsBu_2$, and $(C_5H_{11})_2IndiumAsBu_2$.

9.3 To prepare $(C_5H_{11})_2GaPBu_2$, $LiP^tBu_2$ was initially prepared by the addition of $HP^tBu_2$ (5 g, 33.4 mmol) to a stirred solution of $^nBuLi$ (14.24 cm$^3$ of 2.5 M solution in hexanes, 35.6 mmol) diluted further with petroleum spirits (60–80° C., 50 cm$^3$, 0° C.). The solution was left to stir overnight, concentrated, and then left to crystallise. $(C_5H_{11})_2GaCl(2)$ (2.56 g, 10.34 mmol) was dissolved in ether (60 cm$^3$) and stirred at 0° C. $LiP^tBu_2$ (1.57 g, 10.33 mmol) was slowly added and the mixture was allowed to reach ambient temperature. After stirring overnight, the solvent was removed under vacuum leaving a white solid. Petroleum spirits (60–80° C.) (30 cm$^3$) were added to the solid. After decanting the supernatant, the solution was concentrated and left to crystallise at −25° C. Colourless, triangular shaped crystals formed, yield 3.12 g, (84%), m.p. 81° C.

10. Summary

The results reported here clearly show that nanocrystalline materials such as nanocrystalline MeSe can be easily prepared from molecular compounds such as MeCddsc. Moreover, these prepared nanocrystalline materials can be used as or in high quality semiconductors.

Other modifications of the present invention will be apparent to those skilled in the art.

REFERENCES

1. D. Duonghong, J. Rarnsden and M. Gratzell, *J. Am. Chem. Soc.* 1982, 104, 2977.
2. R. Rossetti, J. L. Ellison, J. M. Gibson and L. E. Brus, *J. Chem. Phys.*, 1984, 80, 4464.
3. A. Henglein, *Chem. Rev.*, 1989, 89, 1861.
4. M. L. Steigerwald and L. E. Brus, *Acc. Chem. Res.*, 1990, 23, 183.
5. Y. Wang and N. Herron, *J. Phys. Chem.* 1991, 95, 525.
6. H. Weller, *Adv. Mater.* 1993, 5, 88.
7. A. Hagfeldt and M. Gratzell, *Chem. Rev.* 1995, 95, 49.
8. L. E. Brus, *J. Chem. Phys.* 1984, 80, 4403.
9. L. Brus, *J. Phys. Chem.* 1986, 90, 2555.
10. P. E. Lippens and M. Lannoo, *Phys. Rev.B* 1989, 39, 10935.
11. Y. Nosaka, *J. Phys. Chem.* 1991, 95, 5054.
12. V. L. Colvin, M. C. Schlamp, A. P. Alivisatos, *Nature* 1994, 370, 354.
13. B. O. Dabbousi, M. G. Bawendi, O. Onitsuka and M. F. Rubner, *Appl. Phys. Lett.*, 1995, 66, 1317.
14. R. S. Urquhart, D. Neil Furlong, T. Gengenbach, N. J. Geddes and F. Grieser, *Langmuir*, 1995, 11, 1127.
15. Y. Wang and N. Herron, *J. Phys. Chem.* 1987, 91, 257.
16. H. J. Watzke and J. N. Fendler, *J. Phys. Chem.* 1987, 91, 854.
17. P. C. Sercel, W. A. Saunders, H. A. Atwater, K. J. Vahala, and R. C. Flagan, *Appl. Phys. Lett.* 1992, 61, 696.
18. V. Sankaran, J. Yue, R. E. Cohen, R. R. Schrock and R. J. Silbey, *Chem. Mater.*, 1993, 5, 1133.
19. A. Mews, A. Eychmnuller, M. Giersig, D. Schooss and H. Weller, *J. Phys. Chem.* 1994, 98, 934.
20. O. V. Salata, P. J. Dobson, P. J. Hull and J. L. Hutchison, *Appl. Phys. Lett.* 1994, 65, 189.
21. M. L. Steigerwald, A. P. Alivisatos, J. M. Gibson, T. D. Harris, R. Kortan, A. M. Muller, A. M. Thayer, T. M. Duncan, D. C. Douglas and L. E. Brus, *J. Am. Chem. Soc.* 1988, 110, 3046.
22. A. R. Kortan, R. Hull, R. L. Opila, M. G. Bawendi, M. L. Steigerwald, P. J. Carroll and L. E. Brus, *J. Am. Chem. Soc.* 1990, 112, 1327.
23. J. G. Brenman, T. Siegrist, P. J. Carroll, M. Stuczynski, L. E. Brus and M. L. Steigerwald, *J. Am. Chem. Soc.* 1989, 111, 4141.
24. C. B. Murray, D. J. Norris and M. G. Bawendi, *J. Am. Chem. Soc.*, 1993, 115, 8706.
25. J. E. Bowen Katari, V. L. Colvin and A. P. Alivisatos, *J. Phys. Chem.* 1994, 98, 4109.
26. N. Chestnoy, T. D. Harris, R. Hull, and L. E. Brus, *J. Phys. Chem.*, 1986, 90, 3393.
27. M. B. Hursthouse, M. Azad Malik, M. Motevalli and P. O'Brien, *Polyhedron*, 1992, 11, 45.
28. G. W. Mason, S. McCarthy and D. F. Peppard, *J. Inorg. Nuclear Chem.*, 1960, 12, 315.

What is claimed is:

1. A process for preparing a nanocrystalline material comprising at least a first ion and at least a second ion different from the first ion, the process comprising:

a single-step pyrolysis of a metal complex of the formula $ML_n$ in a dispersing medium suitable to form the nanocrystalline material, wherein:

M represents a metal ion selected from the group consisting of a cadmium ion, a zinc ion, a lead ion, a mercury ion, an aluminum ion, an indium ion, a gallium ion and combinations thereof;

L represents one or more ligands selected from the group consisting of a sulphide group, a phosphide group, a thiol-carbamate group, a dithiol-carbamate group, a seleno-carbamate group, a diseleno-carbamate group, an organic group, a thio group and combinations thereof; and n represents the valency of M;

further wherein the dispersing medium is at a temperature to allow formation of the nanocrystalline material by pyrolysis when the contacted with the metal complex.

2. The process according to claim 1 wherein the organic group is a di-$C_{1-6}$ alkyl group and/or thio group is a dithio group.

3. The process according to claim 1 wherein the organic group is an alkyl group which may be substituted and/or unsaturated.

4. The process according to claim 1 wherein the organic group is a dialkyl group, which may be substituted and/or unsaturated, and/or wherein the thio group is a dithio group.

5. The process according to claim 1 wherein the dispersing medium is at a temperature of 250° C. or more.

6. The process according to claim 5, wherein the dispersing medium is at a temperature of about 300° C. to 350° C.

7. The process according to claim 1 wherein the dispersing medium passivates the surface of the nanocrystalline material.

8. The process according to claim 1 wherein the nanocrystalline material is selected from the group consisting of cadmium selenide, cadmium sulphide, zinc selenide, zinc sulphide, indium phosphate, gallium arsenide, and ternary and quaternary combinations thereof.

9. The process of claim 8, wherein the nanocrystalline material is cadmium selenide.

10. The process of claim 1 wherein the group includes an oxide ion, a selenide ion, or an arsenide ion.

11. The process of claim 10 wherein the group includes an oxide ion.

12. The process of claim 10 wherein the group includes a selenide ion.

13. The process of claim 10 wherein the group includes an arsenide ion.

14. The process of claim 1 wherein the metal complex is $((CH_3)CdSe_2CN(C_2H_5)_2)_2$, $(CH_3)_2InS_2CN(C_2H_5)_2$, $(CH_3)_2GaS_2CN(C_2H_5)_2$, $(C_2H_5)_2InS_2CN(C_2H_5)_2$, $(C_2H_5)_2GaS_2CN(C_2H_5)_2$, $(Np_2)_2InS_2CN(C_2H_5)_2$, $(Np_2)_2GaS_2CN(C_2H_5)_2$, $(Zn(S_2CNMe^iPr)_2)_2$, $(Cd(S_2CNMe^iPr)_2)_2$, $(Zn(As_2CNMe^iPr)_2)_2$, $(Cd(As_2CNMe^iPr)_2)_2$, $(C_5H_{11})_2GaP^tBu_2$, $(C_5H_{11})_2IndiumP^tBu_2$, $(C_5H_{11})_2IndiumAs^tBu_2$, or $(C_5H_{11})_2GalliumAs^tBu_2$.

15. The process of claim 14 wherein the metal complex is $((CH_3)CdSe_2CN(C_2H_5)_2)_2$, $(CH_3)_2InS_2CN(C_2H_5)_2$, $(CH_3)_2GaS_2CN(C_2H_5)_2$, $((C_2H_5)_2InS_2CN(C_2H_5)_2$, $(C_2H_5)_2GaS_2CN(C_2H_5)_2$, $(Np_2)_2InS_2CN(C_2H_5)_2$, $(Np_2)_2GaS_2CN(C_2H_5)_2$, $(Zn(S_2CNMe^iPr)_2)_2$, $(Cd(S_2CNMe^iPr)_2)_2$, $(Zn(As_2CNMe^iPr)_2)_2$, $(Cd(As_2CNMe^iPr)_2)_2$, $(C_5H_{11})_2GaP^tBu_2$.

16. The process of claim 1 wherein the metal complex is methyl diethyldiselenocarbamato cadmium II.

17. The process of claim 1 wherein the metal complex is diethyl diselenocarbamato cadmium or dithio diselenocarbamato cadmium.

18. The process of claim 1 wherein the metal complex contains at least one organic group and has a Formula II or III $$(R^{II}\text{-}M^{II}\text{-}(E_xCNRR^I)_y)_2 \qquad \text{(Formula II)}$$

$$((R^{II})(R^{III})\text{-}M^{III}\text{-}(E_xCNRR^I)_y)_z \qquad \text{(Formula III)}$$

wherein R, $R^I$, $R^{II}$, and $R^{III}$, independently represent an aryl or alkyl group which may be substituted or unsubstituted, $M^{II}$ is a divalent metal ion, $M^{III}$ is a trivalent metal ion, E is any one of an oxide ion, a selenide ion, a sulphide group, phosphide group, or an arsenide ion, or combinations thereof, and x, y and z are intergers.

19. The process of claim 18 wherein x is 2, y is 1, and z is 1 or 2.

20. The process of claim 19 wherein z is 2.

21. The process of claim 1 wherein the metal complex contains at least one organic group and has a Formula V or VI $$R^{II}\text{-}M\text{-}(E_2CNA_2)_n \qquad \text{(Formula V)}$$

$$(R^{II})_n\text{-}M\text{-}(E_2CNA_2) \qquad \text{(Formula VI)}$$

wherein M is zinc, cadmium, lead, gallium or indium, n is 1 when M is zinc, cadmium, or lead, n is 2 when M is gallium or indium, E is S or Se, A is an aryl or alkyl group, and $R^{II}$ independently represents an aryl or alkyl group which may be substituted or unsubstituted.

22. The process of claim 1 wherein the metal complex is a thiolate, a thiophosphinate, or a phosphinochalogen.

* * * * *